(12) United States Patent
Chiu

(10) Patent No.: US 6,873,670 B1
(45) Date of Patent: Mar. 29, 2005

(54) AUTOMATIC PRE-SCALER CONTROL FOR A PHASE-LOCKED LOOP

(75) Inventor: Hon Kin Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 291 days.

(21) Appl. No.: 10/264,358

(22) Filed: Oct. 4, 2002

(51) Int. Cl.$^7$ ................................................. H03D 3/24
(52) U.S. Cl. ........................ 375/375; 375/374; 375/376; 327/148; 327/157
(58) Field of Search ................................ 375/376, 375, 375/374; 327/147, 148, 151, 156, 157, 160

(56) References Cited

U.S. PATENT DOCUMENTS

| | | | | |
|---|---|---|---|---|
| 4,392,253 A | * | 7/1983 | Yamada et al. | 455/165.1 |
| 5,202,906 A | * | 4/1993 | Saito et al. | 331/14 |
| 6,496,556 B1 | * | 12/2002 | Huehne et al. | 377/2 |
| 6,747,519 B2 | * | 6/2004 | Jaehne et al. | 331/16 |
| 2003/0165209 A1 | * | 9/2003 | Chen et al. | 375/376 |

OTHER PUBLICATIONS

Edited by Behzad Razavi, Monolithic Phase–locked Loops and Clock Recovery Circuits, Theory and Design, *IEEE Press*, 1996, Section 4.8, pp. 15–16.

* cited by examiner

Primary Examiner—Temesghen Ghebretinsae
(74) Attorney, Agent, or Firm—Brett A. Hertzberg; Merchant & Gould P.C.

(57) ABSTRACT

A phase locked loop (PLL) system is arranged to automatically adjust the pre-scaler divide ratio. The PLL includes a phase-frequency detector circuit that compares a feedback clock signal to an input clock signal to provide UP and DOWN signals. A charge-pump circuit provides an oscillator control signal in response to UP and DOWN. A VCO produces an oscillator signal in response to the oscillator control signal. A first divider circuit provides an output clock signal in response to the oscillator signal, where an up-down counter circuit controls the divider ratio. A second divider circuit provides the feedback clock signal in response to the output clock signal. The up-down counter evaluates the output of the window comparator, which analyzes the oscillator control signal for proper operation with the VCO.

11 Claims, 1 Drawing Sheet

AUTOMATIC PRE-SCALER CONTROL FOR A PHASE-LOCKED LOOP

FIELD OF THE INVENTION

The present invention is related to a method and system for adjusting the divider ratio of a pre-scaler in a phase-locked loop (PLL). More particularly, the present invention is related to a window comparator that is arranged to cooperate with a programmable up/down counter such that the pre-scaler in the PLL is automatically adjusted.

BACKGROUND OF THE INVENTION

Phase-locked loop (PLL) circuits are useful in many electronic systems. Example application for PLL circuits include master clock generation for a microprocessor system, clock generation for a sampling clock in an analog-to-digital conversion system, clock generation for data recovery in a low-voltage differential signal (LVDS) driver/receiver system, as well as numerous other applications.

PLL applications typically provide an output clock signal by comparing the output clock signal to a reference clock signal. A phase-frequency detector (PFD) circuit is often employed to provide a raw control signal to a loop filter. The phase-frequency detector circuit provides the raw control signal in response to comparing the phase and frequency of the output clock signal to the reference clock signal. The loop filter often is a low-pass filter (LPF) that is arranged to provide a smoothed or averaged control signal in response to raw control signal. A voltage-controlled oscillator (VCO) is arranged to receive the control signal from the loop filter. The VCO produces the clock signal in response to the control signal such that the frequency of the clock is varied until the phase and frequency of the clock signal are matched to the reference clock signal.

One example PLL circuit includes a PFD circuit that provides UP and DOWN signals in response to the comparison between the output clock signal and the reference clock signal. The UP signal is active when the frequency of the output clock signal is low, while the DOWN signal is active when the frequency of the output clock signal is determined to be high. Similarly, the UP signal is active when the phase of the output clock is lagging behind the phase of the reference clock, and the DOWN signal is active when the phase of the output clock is leading the phase of the reference clock.

SUMMARY OF THE INVENTION

An apparatus that automatically adjusts a pre-scaler is also described below. The apparatus includes a phase-frequency detector circuit that is arranged to produce an UP and DOWN signal in response to a comparison between an input clock signal and a feedback clock signal. A charge pump circuit is arranged to provide an oscillator control signal. The charge pump circuit is further arranged to increase the oscillator control signal in response to an UP signal, and decrease the oscillator signal in response to a DOWN signal. A voltage-controlled oscillator is arranged to provide an oscillator signal that has an associated frequency. The voltage-controlled oscillator is configured to change the frequency of the oscillator signal in response to the oscillator control signal. A divider circuit is configured to provide an output clock signal in response to the oscillator signal. The output clock signal is related to the oscillator signal by a divide ratio that corresponds to M. The divide ratio is adjusted in response to a divider control signal. A window comparator circuit is configured to provide a count up signal when the oscillator control signal exceeds a first predetermined amount that is associated with a first reference node. The window comparator is also configured to provide a count down signal when the oscillator control signal is below a second predetermined amount that is associated with a second reference node. An up-down counter circuit is configured to provide the divider control signal. The divider control signal increases when the count up signal is evaluated as active. The divider control signal is decreased when the count down signal is evaluated as active. The window comparator circuit and the up-down counter circuit are arranged to automatically adjust the divider control signal.

Another apparatus that automatically adjusts a pre-scaler is also described below. A means for producing charge up and charge down signals is arranged to provide the charge up and charge down signals in response to a phase-frequency comparison between an input clock signal and a feedback clock signal. A means for providing an oscillator control signal is arranged to provide the oscillator control signal in response to the charge up and charge down signals. A means for providing an oscillator signal is arranged to provide the oscillator signal in response to the oscillator control signal. A means for providing an output clock signal is arranged to provide the output clock signal in response to the oscillator signal, wherein the output clock signal is related to the oscillator signal by a factor of M. A means for providing the feedback clock signal is arranged to provide the feedback clock signal in response to the output clock signal, wherein the feedback clock signal is related to the output clock signal by a factor of N. A means for analyzing the oscillator control signal is arranged to determine when to adjust the pre-scaler, wherein the means for analyzing is arranged to provide a count up signal when the oscillator control signal is above a first predetermined amount, and also arranged to provide a count down signal when the oscillator control signal is below a second predetermined amount. A means for evaluating the count up and count down signals is arranged to adjust the factor M in response to the count up and count down signals.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION OF THE PREFERRED EMBODIMENT

Figure 1:
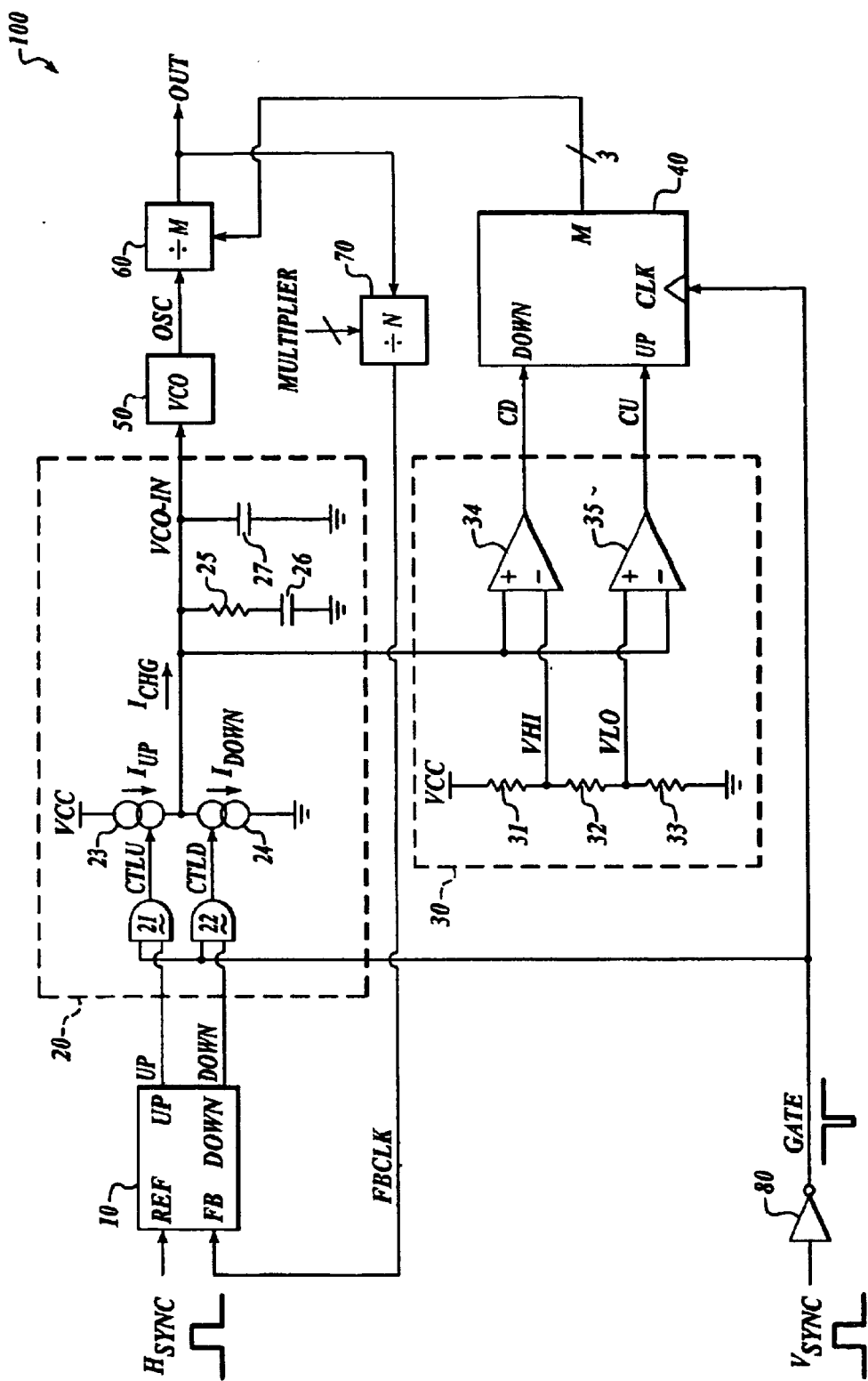
FIG. 1 is a schematic diagram of an exemplary phase-locked loop system that is arranged in accordance with the present invention.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

A phase locked loop (PLL) system that is arranged in accordance with the present invention automatically adjusts the pre-scaler divide ratio. The PLL includes a phase-frequency detector circuit that compares a feedback clock signal to an input clock signal to provide UP and DOWN signals. A charge-pump circuit provides an oscillator control signal in response to UP and DOWN. A VCO produces an oscillator signal in response to the oscillator control signal. A first divider circuit provides an output clock signal in response to the oscillator signal, where an up-down counter circuit controls the divider ratio. A second divider circuit provides the feedback clock signal in response to the output clock signal. The up-down counter evaluates the output of the window comparator, which analyzes the oscillator control signal for proper operation with the VCO.

FIG. 1 is a schematic diagram of an exemplary PLL system (100) that employs automatic pre-scaler adjustment in accordance with the present invention. PLL system 100 includes a phase-frequency detector circuit (10), a charge pump circuit (20), a window comparator circuit (30), an up-down counter circuit (40), a VCO circuit (50), two divider circuits (60, 70), and a logic inverter circuit (80).

Phase-frequency detector circuit 10 is arranged to operate as a means for producing charge up and charge down signals (UP, DOWN) in response to a phase-frequency comparison between an input clock signal (HSYNC) and a feedback clock signal (FBCLK). In one example, the input clock signal corresponds to a horizontal sync signal in a video display system. Charge pump circuit 20 is arranged to operate as a means for providing an oscillator control signal (VCO_IN) in response to the UP and DOWN signals and a gating signal (GATE). The gating signal corresponds to an inverse of a synchronization pulse signal (VSYNC) that is provided by inverter 80. In one example the synchronization pulse signal corresponds to a vertical sync pulse in a video display system. VCO 50 is arranged to operate as a means for providing an oscillator signal (OSC) in response to the oscillator control signal (VCO_IN). The first divider circuit (60) is arranged to operate as a means for providing an output clock signal (OUT) in response to the oscillator signal (OSC). The output clock signal (OUT) is related to the oscillator signal (OSC) by a factor of M, which corresponds to the divide ratio of divider circuit 60. The second divider circuit (70) is arranged to operate as a means for providing the feedback clock signal (FBCLK) in response to the output clock signal (OUT). The feedback clock signal (FBCLK) is related to the output clock signal (OUT) by a factor of N, which corresponds to the divide ratio of divider circuit 70. The up-down counter circuit (40) is arranged to operate as a means for evaluating the count up (CU) and count down (CD) signals to adjust the factor M, which corresponds to the pre-scaler divide ratio of divider circuit (60) in the PLL. The up-down counter circuit (40) counts up in response to a count up signal (CU), and counts down in response to a count down signal (CD). The count up and count down signals (CU, CD) are evaluated when the up-down counter (40) is clocked by the GATE signal. The Window comparator is arranged to operate as a means for providing the count up and count down signals (CU, CD) in response to the oscillator control signal (VCO_IN).

Charge-pump circuit 20 includes two AND logic gates (21, 22), two selectable current sources (23, 24), a resistor (25), and two capacitors (26, 27). AND logic gate 21 is arranged to provide a first control signal (CTLU) when the GATE signal and the UP signal both correspond to a logic "1". AND logic gate 22 is arranged to provide a second control signal (CTLD) when the GATE signal and the DOWN signal both correspond to a logic "1". The first control signal (CTLU) is arranged to selectively activate current source 23. The second control signal (CTLD) is arranged to selectively activate current source 24. Current source 23 is configured to provide a first current (IUP) when active, while current source 24 is configured to provide a second current (IDOWN) when active. The first and second currents (IUP, IDOWN) are provided to a filter as a charging current (ICHG). Current sources 23 and 24 are thus arranged to operate as a means for providing charging currents in response to the charge up and charge down control signals. The parallel combination of capacitor 27, and series coupled resistor 25 and capacitor 26, are configured to operate as a filter. The filter produces the oscillation control signal in response to the charging current (ICHG), and thus operates as a means for integrating the positive and negative charging currents. Capacitor 26 is arranged to integrate the charging current (ICHG), while capacitor 27 is arranged to minimize glitching in the oscillator control signal. The charging current has a positive polarity when current source 23 is active, and a negative polarity when current source 24 is active.

Window comparator circuit 30 includes two comparators (34, 35) and three resistors (31–33). Comparator 34 is arranged to provide the count down signal (CD) as a logic "1" when the oscillator control signal exceeds a first predetermined level (VHI). Comparator 35 is arranged to provide the count up signal (CU) as a logic "1" when the oscillator control signal is below a second predetermined level (VLO). When the oscillator control signal is between the first and second predetermined levels, the count up and count down signals are maintained as logic "0". The pre-scaler setting in the system corresponds to the divider ratio (M), which is adjusted every time the up-down counter (40) either increases or decreases in value. The output of the window comparator is evaluated after each cycle of the GATE signal. The window comparator is arranged to operate as a means for analyzing the oscillator control signal to determine when to adjust the pre-scaler via the count up and count down signals.

Resistors 31–33 are arranged to operate as an exemplary means for providing the first and second predetermined levels (VHI, VLO). Other circuit arrangements may be employed such as a series of stacked transistors that are biased to operate as resistors, a series of diode devices that are arranged in a stack, or another circuit that is configured to provide the first and second predetermined levels. For the example illustrated in FIG. 1, VHI corresponds to VCC*2/3, and VLO corresponds to VCC/3 when resistors 31–33 are of equal value. The reference levels associated with the first and second predetermined levels correspond to the operating voltage range of the voltage-controlled oscillator (VCO 50). Thus, each VCO may have different voltage range requirements for the oscillator control signal.

The AND logic gates (21, 22) in the charge pump circuit (20) are arranged to operate as a means for gating the UP and DOWN signals in response to a GATE signal. The current sources (23, 24) in the charge pump circuit (20) are effectively disabled when the GATE signal corresponds to logic "0". Thus the AND logic gates (21, 22) may also be described as a means for disabling the first and second current sources (23, 24). The up-down counter is configured to evaluate the count UP (CU) and count DOWN (CD) signals in response to the rising edge of the GATE signal. Since the GATE signal effectively disables current sources 23 and 24, the oscillator control signal is stable when evaluated by the window comparator (30).

Once the input clock and the feedback clock signals are substantially in phase with one another, the frequency of the PLL is "acquired" or "locked". Since the phase-frequency detector circuit (10) drives the charge-pump circuit (20), the frequency of the PLL is "locked" when the input clock (HSYNC) and the feedback clock (FBCLK) signals are substantially in phase with one another. The multiplier setting for the feedback clock signal (FBCLK) corresponds to N in divider circuit 70. By adjusting N the user can select a desired frequency scaling. The frequency associated with the output clock (fout) is related to the frequency associated with the input clock (fin) by the multiplier setting for the feedback clock signal, such that fout=fin*N. The pre-scaler will be automatically adjusted so that the desired frequency scaling can be "captured" by the PLL.

In one example, the frequency of feedback clock signal (FBCLK) is initially lower than the frequency of the input clock signal (HSYNC) and the phase-frequency detector circuit (10) will assert the UP signal, while the DOWN signal is set to zero. While the gating signal (GATE) is logic "1", current ICHG will have a positive polarity such that capacitors 26 and 27 will begin to charge. The oscillator control signal (VCO_IN) will increase while the positive charging current is applied. The VCO will increase the frequency of the oscillator signal (OSC) while the oscillator control signal is increasing. After each cycle of the gating signal, the window comparator circuit (30) evaluates the oscillator control signal. The window comparator circuit (30) will assert CD when the oscillator control signal exceeds the first predetermined level. On the next rising edge of the gating signal, the up-down counter will decrease the count (M) such that divider 60 increases the frequency of the output clock signal (OUT). The process described above will continue until the oscillator control signal stabilizes between the first and second predetermined levels, indicating that the multiplier ratio for divider 60 is in the proper range for capturing the frequency lock. Signals UP and DOWN will be zero when the frequency and phase of the input clock signal (HSYNC) are matched by the feedback clock (FBCLK).

In another example, the frequency of feedback clock signal (FBCLK) is initially higher than the frequency of the input clock signal (HSYNC) and the phase-frequency detector circuit (10) will assert the DOWN signal, while the UP signal is set to zero. While the gating signal (GATE) is logic "1", current ICHG will have a negative polarity such that capacitors 26 and 27 will begin to discharge. The oscillator control signal (VCO_IN) will decrease while the negative charging current is applied. The VCO will decrease the frequency of the oscillator signal (OSC) while the oscillator control signal is decreasing. After each cycle of the gating signal, the window comparator circuit (30) evaluates the oscillator control signal. The window comparator circuit (30) will assert CU when the oscillator control signal drops below the second predetermined level. On the next rising edge of the gating signal, the up-down counter will increase the count (M) such that divider 60 decreases the frequency of the output clock signal (OUT). The process described above will continue until the oscillator control signal stabilizes between the first and second predetermined levels, indicating that the multiplier ratio for divider 60 is in the proper range for capturing the frequency lock. Signals UP and DOWN will be zero when the frequency/phase of the input clock signal (HSYNC) are matched by the feedback clock (FBCLK).

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus, comprising:
   a phase-frequency detector circuit that is arranged to produce an UP and DOWN signal in response to a comparison between an input clock signal and a feedback clock signal;
   a charge pump circuit that is arranged to provide an oscillator control signal, wherein the charge pump circuit is further arranged to increase the oscillator control signal in response to an UP signal, and decrease the oscillator signal in response to a DOWN signal; a voltage-controlled oscillator that is arranged to provide an oscillator signal that has an associated frequency, wherein the voltage-controlled oscillator is configured to change the frequency of the oscillator signal in response to the oscillator control signal;
   a divider circuit that is configured to provide an output clock signal response to the oscillator signal, wherein the output clock signal is related to the oscillator signal by a divide ratio that corresponds to M, where the divide ratio is adjusted in response to a divider control signal;
   a window comparator circuit that is configured to provide a count up signal when the oscillator control signal exceeds a first predetermined amount that is associated with a first reference node, and wherein the window comparator is also configured to provide a count down signal when the oscillator control signal is below a second predetermined amount that is associated with a second reference node; and
   an up-down counter circuit that is configured to provide the divider control signal, wherein the divider control signal increases when the count up signal is evaluated as active, and the divider control signal is decreased when the count down signal is evaluated as active, whereby the window comparator circuit and the up-down counter circuit automatically adjust the divider control signal.

2. The apparatus of claim 1, wherein the window comparator circuit includes a reference circuit that is arranged to provide the first and second predetermined amounts, wherein the predetermine amounts are matched to the operating range of the oscillator control signal for the voltage-controlled oscillator.

3. The apparatus of claim 2, wherein the reference circuit comprises a first resistor that is coupled between a power supply and the first reference node, a second resistor that is coupled between the first reference node and the second reference node, and a third resistor that is coupled between the second reference node and another power supply node, wherein the first node has an associated voltage that corresponds to the first predetermined amount, and the second reference node has another associated voltage that corresponds to the second predetermined amount.

4. The apparatus of claim 1, wherein the window comparator circuit comprises: a first comparator and a second comparator, wherein the first comparator is arranged to provide the count down signal when the oscillator control signal exceeds the first predetermined amount, and wherein the second comparator is arranged to provide the count up signal when the oscillator control signal is below the second predetermined amount.

5. The apparatus of claim 1, wherein the charge pump circuit comprises a first current source, a second current source, and a filter circuit, wherein the first current source is arranged to provide a positive charging current to the filter circuit in response to the UP signal, the second current source is arranged to provide a negative charging current to the filter circuit, and wherein the filter circuit is arranged to provide the oscillation control signal by integrating the positive and negative charging currents.

6. The apparatus of claim 5, wherein the charge pump circuit further comprises a gating logic circuit that is configured to disable the first and second current sources when the up-down counter evaluates the count up and the count down signals such that the oscillator control signal is maintained during the evaluation.

7. The apparatus of claim 1, further comprising another divider circuit that is configured to provide the feedback clock signal in response to the output clock signal, wherein the feedback clock signal is related to the output clock signal by another divide ratio that corresponds to N, wherein the other divide ratio is adjusted by a multiplier setting.

8. An apparatus, comprising:
   a means for producing charge up and charge down signals is arranged to provide the charge up and charge down signals in response to a phase-frequency comparison between an input clock signal and a feedback clock signal;
   a means for providing an oscillator control signal is arranged to provide the oscillator control signal in response to the charge up and charge down signals;
   a means for providing an oscillator signal is arranged to provide the oscillator signal in response to the oscillator control signal;
   a means for providing an output clock signal is arranged to provide the output clock signal in response to the oscillator signal, wherein the output clock signal is related to the oscillator signal by a factor of M;
   a means for providing the feedback clock signal is arranged to provide the feedback clock signal in response to the output clock signal, wherein the feedback clock signal is related to the output clock signal by a factor of N;
   a means for analyzing the oscillator control signal is arranged to determine when to adjust the means for providing an output clock signal, wherein the means for analyzing is arranged to provide a count down signal when the oscillator control signal is above a first predetermined amount, and also arranged to provide a count up signal when the oscillator control signal is below a second predetermined amount; and
   a means for evaluating the count up and count down signals is arranged to adjust the factor M in response to the count up and count down signals.

9. The apparatus of claim 8, wherein the means for analyzing further includes a means for providing the first and second predetermined levels, wherein the predetermine amounts are matched to the operating range of the oscillator control signal for the means for providing an oscillator signal.

10. The apparatus of claim 8, wherein the means for providing an oscillator control signal further comprises: a means for providing charging currents in response to the charge up and charge down control signals, and a means for integrating the positive and negative charging currents.

11. The apparatus of claim 10, wherein the means for providing an oscillator control signal further comprises a means for gating the charge up and charge down control signals such that the oscillator control signal is unchanged when the means for evaluating is evaluating the count up and count down signals.

* * * * *